United States Patent
Jang

(10) Patent No.: US 6,219,292 B1
(45) Date of Patent: Apr. 17, 2001

(54) SEMICONDUCTOR MEMORY DEVICE HAVING REDUCED POWER REQUIREMENTS DURING REFRESH OPERATION BY PERFORMING REFRESH OPERATION IN A BURST METHOD

(75) Inventor: Ji Eun Jang, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/475,438

(22) Filed: Dec. 30, 1999

(30) Foreign Application Priority Data

Dec. 30, 1998 (KR) .................................................. 98-61959

(51) Int. Cl.$^7$ ......................................................... G11C 7/00
(52) U.S. Cl. ........................ 365/222; 365/226; 365/230.02
(58) Field of Search .............................. 365/222, 189.05, 365/230.06, 230.08, 233, 236, 226, 230.02

(56) References Cited

U.S. PATENT DOCUMENTS

| | | |
|---|---|---|
| 4,691,303 | 9/1987 | Churchward et al. . |
| 4,984,209 | 1/1991 | Rajaram et al. . |
| 5,418,920 | 5/1995 | Kuddes . |
| 5,430,680 | 7/1995 | Parris . |
| 5,453,959 | 9/1995 | Sakuta et al. . |
| 5,583,818 | 12/1996 | You et al. . |
| 5,654,913 | 8/1997 | Fukushima et al. . |
| 5,893,927 | * 4/1999 | Hovie ................................... 711/171 |
| 5,999,481 | * 12/1999 | Cowles et al. ........................ 365/233 |
| 6,055,289 | * 4/2000 | Wright et al. ........................... 377/56 |
| 6,084,822 | * 7/2000 | Maeda ................................. 365/233 |

* cited by examiner

*Primary Examiner*—David Nelms
*Assistant Examiner*—Thong Le
(74) *Attorney, Agent, or Firm*—Jacobson, Price, Holman & Stern, PLLC

(57) ABSTRACT

The present invention relates to a semiconductor memory device which can perform an auto-refresh operation. The semiconductor memory device includes: a mode register set for programming the number of the refresh operations to be consecutively performed; a burst counter for counting the number of the refresh operations according to the output signal from the mode register set; a first timing signal generating unit for generating an internal refresh enable signal for the inside refresh operation according to the output signal from the command decoder; an internal refresh signal generating unit for outputting a previously-set number of internal refresh signals according to the output signal from the first timing signal generating unit; and a NOR gate for NORing the output signal from the command decoder and the output signal from the internal refresh signal generating unit, thereby reducing the number of commands according to a burst shape by using a burst refresh method, and decreasing power consumption during the refresh operation.

10 Claims, 4 Drawing Sheets

SEMICONDUCTOR MEMORY DEVICE HAVING REDUCED POWER REQUIREMENTS DURING REFRESH OPERATION BY PERFORMING REFRESH OPERATION IN A BURST METHOD

BACKGROUND OF THE INVENTION

1. Field of the Invention

The present invention relates to a semiconductor memory device, and in particular to a semiconductor memory device which can reduce system power consumed during a refresh operation by performing the refresh operation in a burst method.

2. Description of the Background Art

In general, a dynamic random access memory (DRAM) employs a capacitor as a unit memory device recording a data, which is called a cell. When a data of '1' (or 'high level') is stored in the cell, a high potential is applied to the cell, and when a data of '0' ( or 'low level') is stored in the cell, a low potential is applied to the cell, thereby recording the data. In an ideal case, the capacitor constituting the cell maintains stored charges, so long as a potential of a connection terminal of the capacitor is not varied. However, actually, as the time elapses, the stored charges are lost as a leakage current. Accordingly, it is impossible to judge whether the recorded data is '1' or '0'. In order to constantly maintain the data, a process of periodically sensing and amplifying the data stored in the cell, and restoring it in the cell is necessary. The process is called a refresh operation.

The refresh operation of the DRAM is divided according to a performing method. The RAS only refresh operation consists of a cycle of externally applying a row address strobe signal and a row address on which the refresh operation is performed, raising a word line selected by the row address, amplifying and re-writing the data of the whole cells connected to the word line by a sense amplifier, and dropping the word line. In this case, in order to refresh the whole cells of the DRAM, all the row addresses must be externally inputted.

So as to overcome the aforementioned disadvantage, there has been suggested the auto-refresh operation (or CBR refresh: CAS before RAS refresh). The auto-refresh operation carries out the 'sensing-amplifying-restoring' operation, identically to the RAS only refresh operation. However, since the row addresses are sequentially generated inside, it is not necessary to externally input the row addresses. Accordingly, a DRAM user needs not to memorize and input the row addresses on which the refresh operation is performed.

FIG. 1 is a block diagram illustrating a conventional semiconductor memory device performing the auto-refresh operation. As shown therein, the semiconductor memory device includes: a memory cell array 1 consisting of a plurality of memory cells storing data; a command decoder 2 for outputting a refresh command REF controlling the refresh operation according to a chip selection signal/CS, a row address strobe signal/RAS, a column address strobe signal/CAS, and a write enable signal/WE; a timing signal generating unit 3 for outputting a refresh enable signal RASEN for the inside refresh operation according to the output signal REF from the command decoder 1; a pulse generating unit 4 for generating a pulse signal disabling the refresh enable signal RASEN by using the output signal RASEN from the timing signal generating unit 3, and supplying it to the timing signal generating unit 3; a multiplexer 7 for outputting an address externally inputted and buffered by an address buffer 5 during the normal operation, and selectively outputting an internal address outputted by a counter 6 counting the output signal from the command decoder 2 during the refresh operation; and a word line driving unit 8 controlled according to the output signal from the timing signal generating unit 3, for driving a word line selected by the address which is selectively outputted by the multiplexer 7.

The timing signal generating unit 3 includes: a first PMOS transistor PM1 and a first NMOS transistor NM1 connected in series between the power voltage VCC and the ground voltage VSS, and having their gates connected to receive the output signal from the pulse generating unit 4 and the refresh command REF, respectively; and first and second inverters INV1, INV2 having their outputs and inputs interactively connected to output the refresh enable signal RASEN by inverting and latching a potential of the commonly-connected drain of the first PMOS transistor PM1 and the first NMOS transistor NM1.

The auto-refresh operation of the conventional semiconductor memory device will now be described with reference to an operational timing diagram of FIG. 2.

Firstly, the command decoder 2 generates the command REF starting the refresh operation from the externally-inputted control signals. That is, the auto-refresh command REF is generated by combining the external chip selection signal/CD, the row address strobe signal/RAS, the column address strobe signal/CAS, and the write enable signal/WE.

For example, in a synchronous DRAM, when the row address strobe signal/RAS is logically low, the column address strobe signal/CAS is logically 'low' and the write enable signal/WE is logically 'high', the auto-refresh command REF is enabled.

Thereafter, the timing signal generating unit 3 generates the internal refresh signal RASEN by using the auto-refresh command REF outputted from the command decoder 2. Accordingly, the internal refresh signal RASEN outputted from the timing signal generating unit 3 is applied to the word line driving unit 8, and controls a signal enabling the word line.

On the other hand, the pulse generating unit 4 generates a precharge signal PCG which is a short pulse in order to automatically perform the precharge operation after a predetermined delay time (until the refresh operation is finished). The precharge signal PCG is a signal for finishing the refresh operation in the synchronous DRAM.

Here, the predetermined delay time is a time when the word line is enabled in the refresh operation, namely a time corresponding to a pulse length tRAS of the row address strobe signal/RAS.

When the conventional semiconductor memory device is normally operated, the address is externally inputted to the address buffer 5, and supplied to the word line driving unit 8 by the multiplexer 7, thereby enabling the word line in order to select the selected cell of the memory cell array 1. In the case that the semiconductor memory device performs the refresh operation, the internal address generated by the counter 6 is supplied to the word line driving unit 8 by the multiplexer 7, thereby refreshing all the cells in the memory cell array 1.

In the auto-refresh operation, when the refresh command is inputted once, the refresh operation is carried out one time. However, when the refresh operation needs to be consecutively performed, the refresh signal must be externally consecutively supplied in the structure of FIG. 1. As a result, the system power is considerably consumed in order to consecutively input the command.

SUMMARY OF THE INVENTION

Accordingly, it is an object of the present invention to provide a semiconductor memory device which can reduce power consumption by consecutively carrying out a refresh operation in a burst method.

In order to achieve the above-described object of the present invention, there is provided a semiconductor memory device including: a memory cell array consisting of a plurality of memory cells storing data; a command decoder for outputting a refresh command controlling a refresh operation according to a chip selection signal, a row address strobe signal, a column address strobe signal, and a write enable signal; a mode register set for programming the number of the refresh operations to be consecutively performed; a burst counter for counting the number of the refresh operation according to the output signal from the mode register set; a first timing signal generating unit for generating an internal refresh enable signal for the inside refresh operation according to the output signal from the command decoder; an internal refresh signal generating unit for outputting a previously-set number of internal refresh signals according to the output signal from the first timing signal generating unit; a NOR gate for NORing the output signal from the command decoder and the output signal from the internal refresh signal generating unit; a second timing signal generating unit for outputting a refresh enable signal for the inside refresh operation according to the output signal from the NOR gate; a pulse generating unit for generating a pulse signal disabling the refresh enable signal by using the output signal from the second timing signal generating unit, and supplying it to the second timing signal generating unit; a counter for outputting an internal address performing the refresh operation according to the output signal for the NOR gate; an address buffer for receiving an external address; a multiplexer for outputting the internal address outputted by the counter during the refresh operation, and selectively outputting the external address inputted to the address buffer during the refresh operation; and a word line driving unit for driving the word line of the memory cell array according to the address which is selectively outputted by the multiplexer.

In addition, the first timing signal generating unit includes: a first PMOS transistor and a first NMOS transistor connected in series between the power voltage and the ground voltage, and having their gates connected to receive the output signal from the burst counter and the refresh command, respectively; and first and second inverters having their inputs and outputs interactively connected to output the internal refresh enable signal by inverting and latching a potential of the commonly-connected drain of the first PMOS transistor and the first NMOS transistor.

The internal refresh signal generating unit includes: a delay unit for delaying the output signal from the word line driving unit for a predetermined time; a first NOR gate for NORing the output signal from the word line driving unit and the output signal from the delay unit; a first NAND gate for NANDing the output signal from the first NOR gate and the internal refresh enable signal from the first timing signal generating unit; and a first inverter for inverting the output signal from the first NAND gate, and outputting the internal refresh command.

The delay time of the delay unit is a precharge time of the row address strobe signal.

The second timing signal generating unit includes: a first PMOS transistor and a first NMOS transistor connected in series between the power voltage and the ground voltage, and having their gates connected to receive the output signal from the pulse generating unit and the output signal from the NOR gate, respectively; and first and second inverters having their inputs and outputs interactively connected to output the refresh enable signal by inverting and latching a potential of the commonly-connected drain of the first PMOS transistor and the first NMOS transistor.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
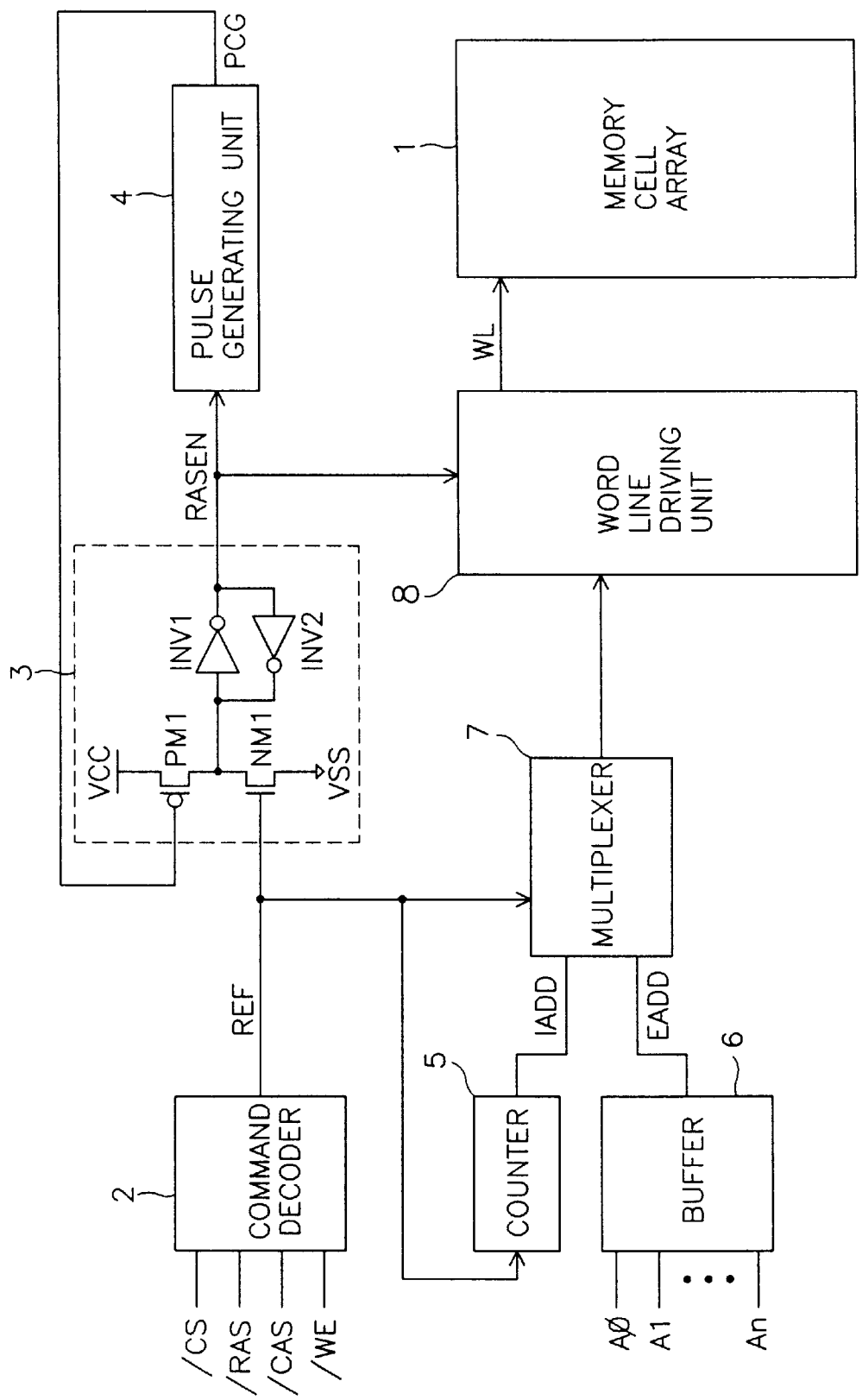
FIG. 1 is a circuit diagram illustrating circuits for a refresh operation in a conventional semiconductor memory device.
Figure 2:
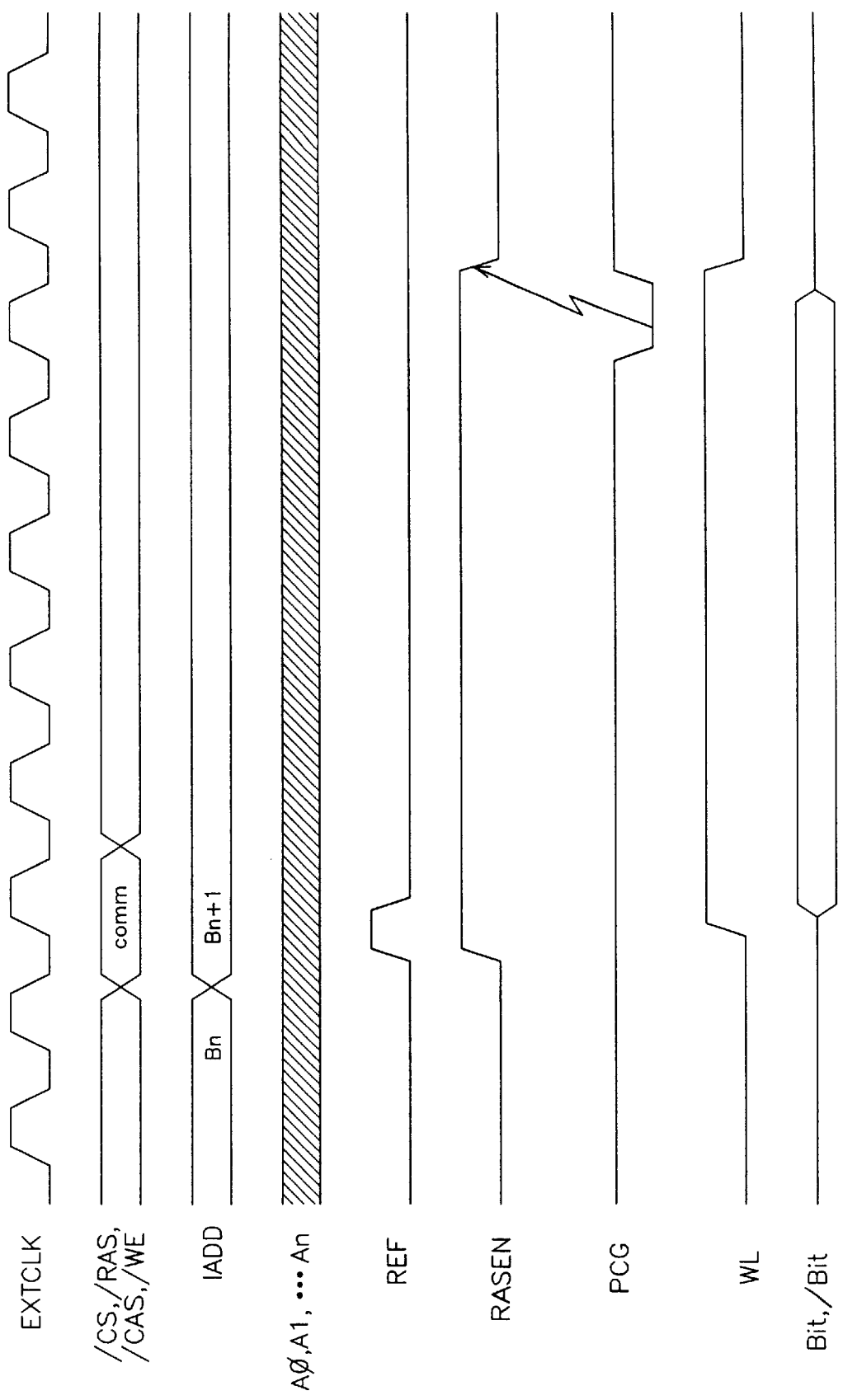
FIG. 2 is an operational timing diagram of the semiconductor memory device as shown in FIG. 1.
Figure 3:
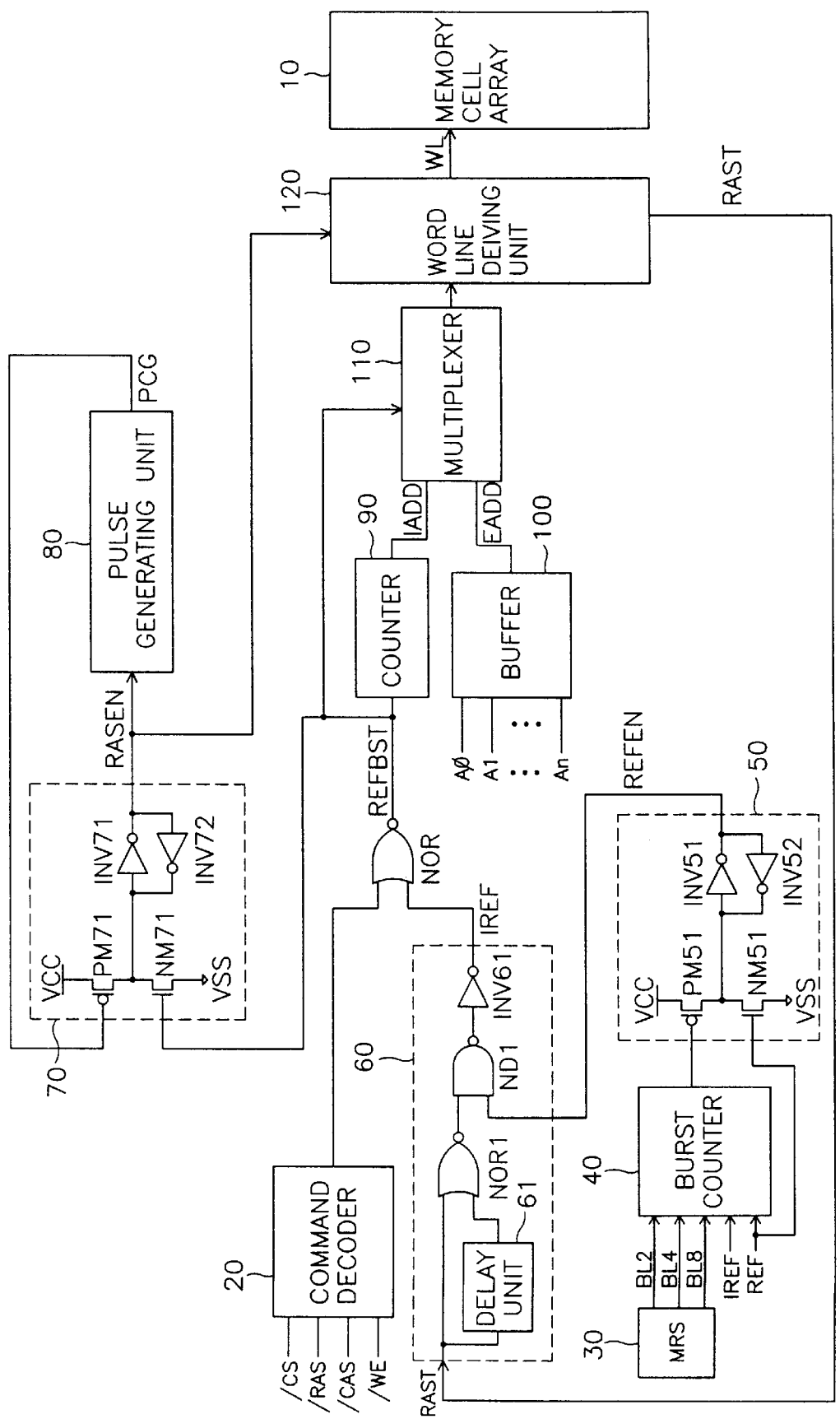
FIG. 3 is a circuit diagram illustrating circuits for a refresh operation in a semiconductor memory device in accordance with the present invention.

FIG. 3 is a block diagram illustrating circuits for performing a refresh operation in a semiconductor memory device in accordance with the present invention. As shown therein, the semiconductor memory device includes: a memory cell array 10 consisting of a plurality of memory cells storing data; a command decoder 20 for outputting a refresh command REF controlling the refresh operation according to a chip selection signal/CS, a row address strobe signal/RAS, a column address strobe signal/CAS, and a write enable signal/WE; a mode register set 30 for programming the number of the refresh operations to be consecutively performed; a burst counter 40 for counting the number of the refresh operations according to the output signal from the mode register set 30; a first timing signal generating unit 50 for generating an internal refresh enable signal REFEN for the inside refresh operation according to the output signal REF from the command decoder 20; an internal refresh signal generating unit 60 for outputting a previously-set number of internal refresh signals IREF according to the output signal REFEN from the first timing signal generating unit 50; a NOR gate NOR for NORing the output signal REF from the command decoder 20 and the output signal IREF from the internal refresh signal generating unit 60; a second timing signal generating unit 70 for outputting a refresh enable signal RASEN for the inside refresh operation according to the output signal REFBST from the NOR gate NOR; a pulse generating unit 80 for generating a pulse signal disabling the refresh enable signal RASEN by using the output signal RASEN from the second timing signal generating unit 70, and supplying it to the second timing signal generating unit 70; a counter 90 for outputting an internal address performing the refresh operation according to the output signal REFBST from the NOR gate NOR; an address buffer 100 for receiving an external address; a multiplexer 110 for outputting the internal address outputted by the counter 90 during the refresh operation, and selectively outputting the external address inputted to the address buffer 80 during the refresh operation; and a word line driving unit 120 for driving the word line of the memory cell array according to the address which is selectively outputted by the multiplexer 110.

The first timing signal generating unit 50 includes: a first PMOS transistor PM51 and a first NMOS transistor NM51 connected in series between the power voltage VCC and the ground voltage VSS, and having their gates connected to receive the output signal BSTENDB from the burst counter 40 and the refresh command REF, respectively; and first and second inverters INV51, INV52 having their inputs and outputs interactively connected to output the internal refresh enable signal REFEN by inverting and latching a potential of the commonly-connected drain of the first PMOS transistor PM51 and the first NMOS transistor NM51.

The internal refresh signal generating unit 60 includes: a delay unit 61 for delaying the output signal RAST from the word line driving unit 120 for a predetermined time; a first NOR gate for NORing the output signal RAST from the word line driving unit 120 and the output signal from the delay unit 61; a first NAND gate ND1 for NANDing the output signal from the first NOR gate NOR1 and the internal refresh enable signal REFEN from the first timing signal generating unit 50; and a first inverter INV61 for inverting the output signal from the first NAND gate ND1, and outputting the internal refresh command IREF.

The delay time of the delay unit is a precharge time tRP of the row address strobe signal/RAS.

In addition, the second timing signal generating unit 70 includes: a first PMOS transistor PM71 and a first NMOS transistor NM71 having their gates connected to receive the output signal from the pulse generating unit 80 and the output signal REFBST from the NOR gate, respectively; and first and second inverters INV71, INV72 having their input and outputs interactively connected to output the refresh enable signal RASEN by inverting and latching a potential of the commonly-connected drain of the first PMOS transistor PM71 and the first NMOS transistor NM71.

The refresh operation of the semiconductor memory device in accordance with the present invention will now be described with reference to FIG. 4.

When the refresh command is externally inputted, the refresh operation is performed according to the refresh command. Here, the generation state of the refresh command is identical to the conventional art. The refresh operation is consecutively carrier out for example, two, four or eight times according to the setting state of the mode register set 30, namely identically to a burst method. Here, a method for determining the number of the refresh operations to be consecutively performed through the mode register set 30 is exemplified. On the other hand, a method for inputting a specific address in the refresh operation, and determining the number of the refresh operations to be consecutively performed can be also applied. For convenience sake, the method using the mode register set will now be explained.

Figure 4:
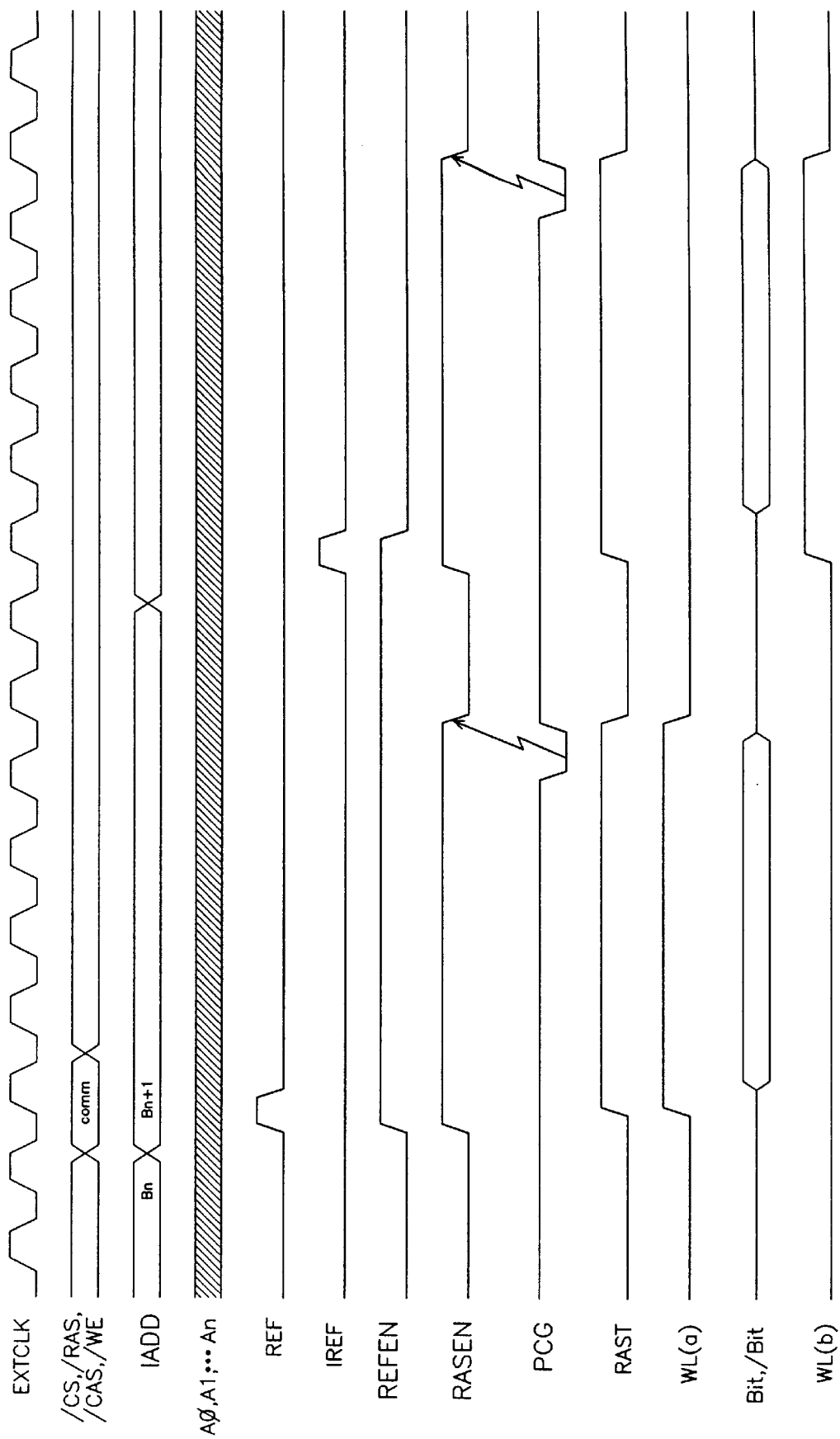
FIG. 4 is an operational timing diagram of the semiconductor memory device as shown in FIG. 3.

In more detail, as illustrated in FIGS. 3 and 4, the internal refresh signal generating unit 60 generates the internal refresh command IREF according to a burst length, after the refresh operation is performed according to the external refresh command. The external refresh command REF and the internal refresh command IREF are NORed by the NOR gate NOR, and inputted to the counter 70, thereby generating the internal address. In addition, the burst counter 40 counts the number of the internal refresh commands IREF according to the burst length, and thus generates the internal refresh command IREF, correspondingly to the burst length. Thereafter, the burst counter 40 disables the internal refresh enable signal REFEN by generating the pulse signal BSTENDB, and thus prevents the internal refresh command from being generated. As a result, it is not necessary to externally consecutively supply the refresh commands during the refresh operation, and thus the system power is less consumed in the consecutive refresh operation In the present specification, the number of the refresh operations to be consecutively performed is programmed by the mode register set MRS. However, it is possible to introduce the method for determining the number of the refresh operations by using the specific address signal which is externally inputted during the refresh operation.

As discussed earlier, while the conventional refresh operation requires the commands as many as the refresh cycles, the burst refresh method in accordance with the present invention can reduce the number of the commands according to the burst shape, thereby decreasing the system power consumption during the refresh operation.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A semiconductor memory device for reducing system power consumption during a refresh operation by performing a consecutive refresh operation in a burst method, comprising:

a memory cell array having a plurality of memory cells storing data;

a command decoder for outputting a refresh command controlling a refresh operation according to a chip selection signal, a row address strobe signal, a column address strobe signal, and a write enable signal;

a mode register set for programming a number of the refresh operations to be consecutively performed, said number of the refresh operations being consecutively performed according to a burst method without externally consecutively supplying a refresh signal for every refresh operation, thereby reducing power consumption;

a burst counter for counting the number of the refresh operations according to the output signal from the mode register set;

a first timing signal generating unit for generating an internal refresh enable signal for an inside refresh operation according to the output signal from the command decoder;

an internal refresh signal generating unit for outputting a previously-set number of internal refresh signals according to the output signal from the first timing signal generating unit;

a NOR gate for NORing the output signal from the command decoder and the output signal from the internal refresh signal generating unit;

a second timing signal generating unit for outputting a refresh enable signal for the inside refresh operation according to the output signal from the NOR gate;

a pulse generating unit for generating a pulse signal disabling the refresh enable signal by using the output signal from the second timing signal generating unit, and supplying it to the second timing signal generating unit;

a counter for outputting an internal address performing the refresh operation according to the output signal from the NOR gate;

an address buffer for receiving an external address;

a multiplexer for outputting the internal address outputted by the counter during the refresh operation, and selectively outputting the external address inputted to the address buffer during the refresh operation; and a word line driving unit for driving the word line of the memory cell array according to the address which is selectively outputted by the multiplexer.

2. The semiconductor memory device according to claim 1, wherein the first timing signal generating unit comprises:

a first PMOS transistor and a first NMOS transistor connected in series between the power voltage and the ground voltage, and having their gates connected to receive the output signal from the burst counter and the refresh command, respectively; and first and second inverters having their inputs and outputs interactively connected to output the internal refresh enable signal by inverting and latching a potential of the commonly-connected drain of the first PMOS transistor and the first NMOS transistor.

3. The semiconductor memory device according to claim 1, wherein the internal refresh signal generating unit comprises:

a delay unit for delaying the output signal from the word line driving unit for a predetermined time;

a first NOR gate for NORing the output signal from the word line driving unit and the output signal from the delay unit;

a first NAND gate for NANDing the output signal from the first NOR gate and the internal refresh enable signal from the first timing signal generating unit; and a first inverter for inverting the output signal from the first NAND gate, and outputting an internal refresh command.

4. The semiconductor memory device according to claim 3, wherein the delay time of the delay unit is a precharge time of the row address strobe signal.

5. The semiconductor memory device according to claim 1, wherein the second timing signal generating unit comprises:

a first PMOS transistor and a first NMOS transistor connected in series between the power voltage and the ground voltage, and having their gates connected to receive the output signal from the pulse generating unit and the output signal from the NOR gate, respectively; and first and second inverters having their inputs and outputs interactively connected to output the refresh enable signal by inverting and latching a potential of the commonly-connected drain of the first PMOS transistor and the first NMOS transistor.

6. A semiconductor memory device comprising:

a memory cell array having a plurality of memory cells storing data;

a command decoder for outputting a refresh command controlling a refresh operation according to a chip selection signal, a row address strobe signal, a column address strobe signal, and a write enable signal;

a mode register set for programming a number of the refresh operations to be consecutively performed;

a burst counter for counting the number of the refresh operations according to the output signal from the mode register set;

a first timing signal generating unit for generating an internal refresh enable signal for an inside refresh operation according to the output signal from the command decoder, said first timing signal generating unit including, a first PMOS transistor and a first NMOS transistor, connected in series between power and ground voltage, and having gates connected to receive the output signal from said burst counter and the refresh command, respectively; and first and second inverters having inputs and outputs interactively connected to output the internal refresh enable signal by inverting and latching a potential of a commonly connected drain of said first PMOS transistor and said first NMOS transistor;

an internal refresh signal generating unit for outputting a previously-set number of internal refresh signals according to the output signal from the first timing signal generating unit;

a NOR gate for NORing the output signal from the command decoder and the output signal from the internal refresh signal generating unit;

a second timing signal generating unit for outputting a refresh enable signal for the inside refresh operation according to the output signal from the NOR gate;

a pulse generating unit for generating a pulse signal disabling the refresh enable signal by using the output signal from the second timing signal generating unit, and supplying it to the second timing signal generating unit;

a counter for outputting an internal address performing the refresh operation according to the output signal from the NOR gate;

an address buffer for receiving and external address;

a multiplexer for outputting the internal address outputted by the counter during the refresh operation, and selectively outputting the external address inputted to the address buffer during the refresh operation; and a word line driving unit for driving the word line of the memory cell array according to the address which is selectively outputted by the multiplexer.

7. A semiconductor memory device comprising:

a memory cell array having a plurality of memory cells storing data;

a command decoder for outputting a refresh command controlling a refresh operation according to a chip selection signal, a row address strobe signal, a column address strobe signal, and a write enable signal;

a mode register set for programming a number of the refresh operations to be consecutively performed;

a burst counter for counting the number of the refresh operations according to the output signal from the mode register set;

a first timing signal generating unit for generating an internal refresh enable signal for an inside refresh operation according to the output signal from the command decoder;

an internal refresh signal generating unit for outputting a previously-set number of internal refresh signals according to the output signal from the first timing signal generating unit;

a NOR gate for NORing the output signal from the command decoder and the output signal from the internal refresh signal generating unit;

a second timing signal generating unit for outputting a refresh enable signal for the inside refresh operation according to the output signal from the NOR gate;

a pulse generating unit for generating a pulse signal disabling the refresh enable signal by using the output signal from the second timing signal generating unit, and supplying it to the second timing signal generating unit;

a counter for outputting an internal address performing the refresh operation according to the output signal from the NOR gate;

an address buffer for receiving an external address;

a multiplexer for outputting the internal address outputted by the counter during the refresh operation, and selectively outputting the external address inputted to the address buffer during the refresh operation;

a word line driving unit for driving the word line of the memory cell array according to the address which is selectively outputted by the multiplexer; and said internal refresh signal generating unit including
   a delay unit for delaying the output signal from the word line driving unit for a predetermined time;
   a first NOR gate for NORing the output signal from the word line driving unit and the output signal from the delay unit;
   a first NAND gate for NANDing the output signal from the first NOR gate and the internal refresh enable signal from the first timing signal generating unit; and
   a first inverter for inverting the output signal from the first NAND gate, and outputting an internal refresh command.

8. A semiconductor memory device comprising:

a memory cell array having a plurality of memory cells storing data;

a command decoder for outputting a refresh command controlling a refresh operation according to a chip selection signal, a row address strobe signal, a column address strobe signal, and a write enable signal;

a mode register set for programming a number of the refresh operations to be consecutively performed;

a burst counter for counting the number of the refresh operations according to the output signal from the mode register set;

a first timing signal generating unit for generating an internal refresh enable signal for an inside refresh operation according to the output signal from the command decoder;

an internal refresh signal generating unit for outputting a previously-set number of internal refresh signals according to the output signal from the first timing signal generating unit;

a NOR gate for NORing the output signal from the command decoder and the output signal from the internal refresh signal generating unit;

a second timing signal generating unit for outputting a refresh enable signal for the inside refresh operation according to the output signal from the NOR gate, said second timing signal generating unit including,
   a first PMOS transistor and a first NMOS transistor, connected in series between power and ground voltage, and having gates connected to receive the output signal from said pulse generating unit and the output signal from the NOR gate, respectively; and
   first and second inverters having inputs and outputs interactively connected to output the refresh enable signal by inverting and latching a potential of a commonly connected dran of said first PMOS transistor and said first NMOS transistor;

a pulse generating unit for generating a pulse signal disabling the refresh enable signal by using the output signal from the second timing signal generating unit, and supplying it to the second timing signal generating unit;

a counter for outputting an internal address performing the refresh operation according to the output signal from the NOR gate;

an address buffer for receiving an external address;

a multiplexer for outputting the internal address outputted by the counter during the refresh operation, and selectively outputting the external address inputted to the address buffer during the refresh operation; and a word line driving unit for driving the word line of the memory cell array according to the address which is selectively outputted by the multiplexer.

9. The semiconductor memory device according to claim 7, wherein the delay time of the delay unit is a precharge time of the row address strobe signal.

10. The semiconductor memory device according to claim 1, wherein said burst counter counts the number of the refresh operations according to a burst length and generates an internal refresh command correspondingly to the burst length.

* * * * *